(12) United States Patent
Lasser

(10) Patent No.: US 7,545,673 B2
(45) Date of Patent: Jun. 9, 2009

(54) USING MLC FLASH AS SLC BY WRITING DUMMY DATA

(75) Inventor: Menahem Lasser, Kohav-Yair (IL)

(73) Assignee: Sandisk IL Ltd., Kfar Saba (IL)

( * ) Notice: Subject to any disclaimer, the term of this patent is extended or adjusted under 35 U.S.C. 154(b) by 69 days.

(21) Appl. No.: 11/861,140

(22) Filed: Sep. 25, 2007

(65) Prior Publication Data

US 2009/0080247 A1    Mar. 26, 2009

(51) Int. Cl.
*G11C 16/04* (2006.01)

(52) U.S. Cl. .............................. 365/185.03; 365/185.28; 365/185.33

(58) Field of Classification Search ............. 365/185.03
See application file for complete search history.

(56) References Cited

U.S. PATENT DOCUMENTS

| 5,043,940 | A |   | 8/1991  | Harari |   |
|---|---|---|---|---|---|
| 5,172,338 | A |   | 12/1992 | Mehrotra et al. |   |
| 5,859,795 | A | * | 1/1999  | Rolandi ....................... | 365/168 |
| 5,867,429 | A |   | 2/1999  | Chen et al. |   |
| 5,930,167 | A |   | 7/1999  | Lee et al. |   |
| 5,982,663 | A | * | 11/1999 | Park ....................... | 365/185.09 |
| 6,426,893 | B1 |   | 7/2002  | Conley et al. |   |
| 6,535,419 | B2 | * | 3/2003  | Parker et al. ............ | 365/185.03 |
| 6,807,106 | B2 | * | 10/2004 | Gonzales et al. ....... | 365/185.33 |
| 7,031,193 | B2 | * | 4/2006  | Micheloni et al. ...... | 365/185.22 |
| 7,164,601 | B2 |   | 1/2007  | Mitani et al. |   |
| 7,180,775 | B2 | * | 2/2007  | Meir ..................... | 365/185.03 |
| 7,308,525 | B2 | * | 12/2007 | Lasser et al. ................. | 711/103 |
| 7,366,013 | B2 | * | 4/2008  | Roohparvar ........... | 365/185.03 |
| 2006/0171210 | A1 |   | 8/2006 | Nagashima et al. |   |
| 2007/0061502 | A1 | * | 3/2007 | Lasser et al. ................. | 711/103 |
| 2007/0089034 | A1 |   | 4/2007 | Litsyn et al. |   |
| 2007/0133249 | A1 |   | 6/2007 | Roohparvar |   |
| 2007/0201274 | A1 |   | 8/2007 | Yu et al. |   |
| 2008/0062763 | A1 | * | 3/2008 | Park et al. ............. | 365/185.11 |
| 2008/0175059 | A1 | * | 7/2008 | Kim et al. ............. | 365/185.12 |

FOREIGN PATENT DOCUMENTS

| EP | 0788113 | 8/1997 |
|---|---|---|
| WO | WO-0163614 | 8/2001 |

OTHER PUBLICATIONS

U.S. Appl. No. 11/618,569.
U.S. Appl. No. 11/377,972.

* cited by examiner

*Primary Examiner*—Son L Mai
(74) *Attorney, Agent, or Firm*—Darby & Darby P.C.

(57) ABSTRACT

A method for storing data includes designating, in a memory array including cells configured for writing a first number of bits per cell, a group of the cells to which input data are to be written at a second number of bits per cell, smaller than the first number. Dummy data that are independent of the input data are stored in a first set of one or more bits of the cells in the group. The input data are written to a second set of at least one other bit of the cells in the group.

18 Claims, 3 Drawing Sheets

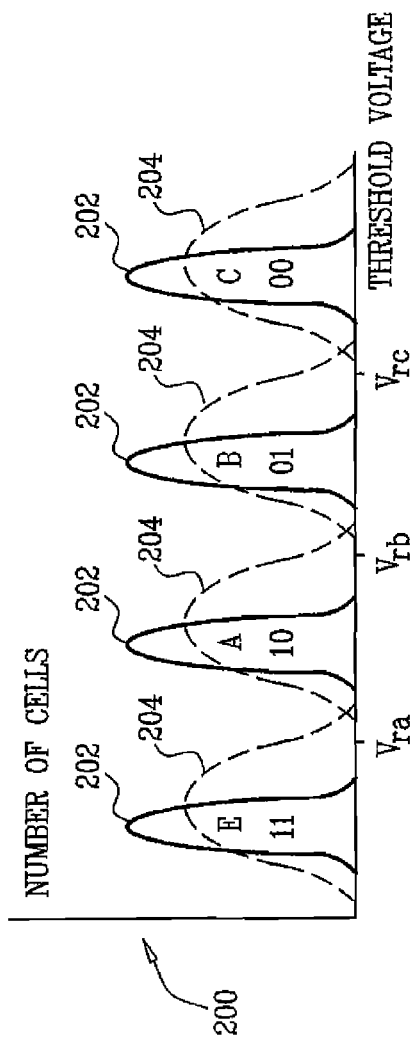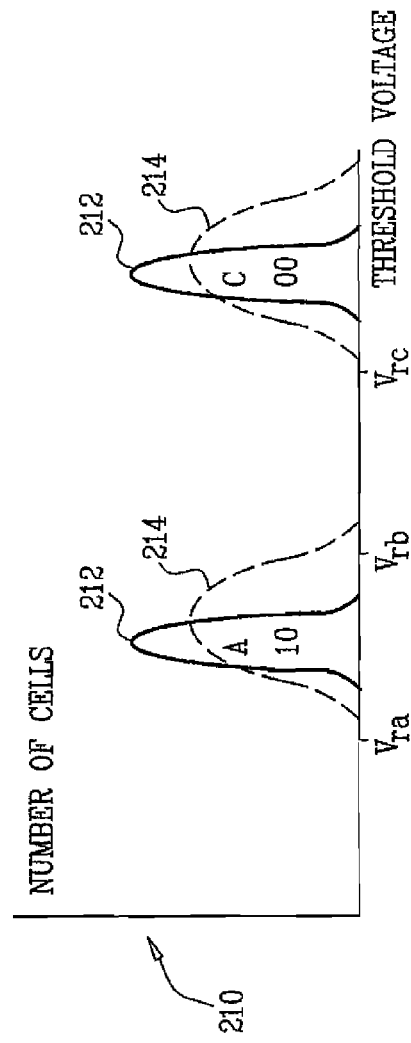

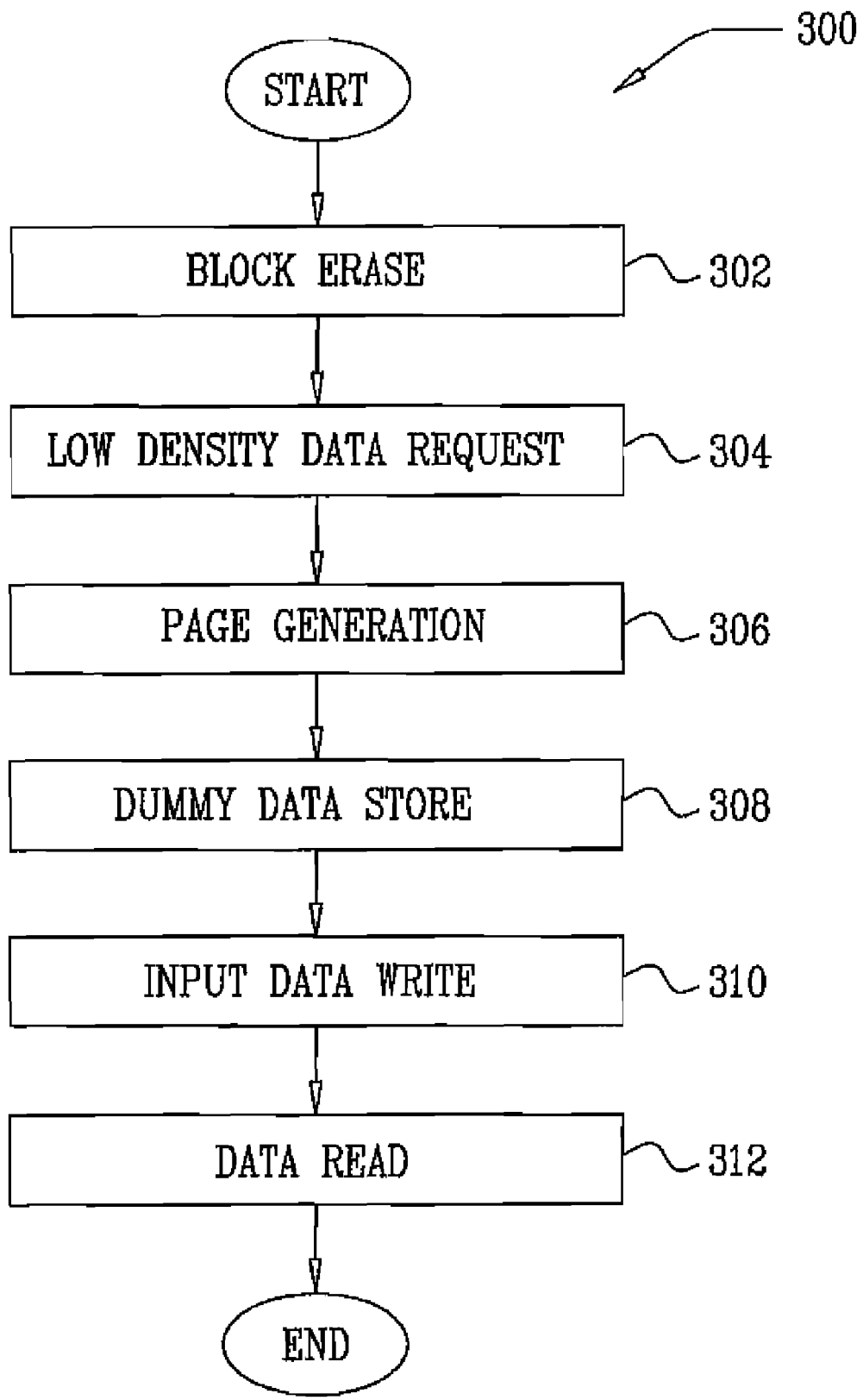

USING MLC FLASH AS SLC BY WRITING DUMMY DATA

FIELD OF THE INVENTION

The present invention relates generally to technology for non-volatile storage.

BACKGROUND OF THE INVENTION

Non-volatile semiconductor memory devices are widely used as memory storage in computers and other electronic appliances. In Single-Level Cell (SLC) memory devices, a charge-retaining gate in each memory cell of the device is designed to retain a charge, such that the gate can be in either a charged state or an erased state. Each memory cell may therefore store a single bit of data, one state representing a logical "1" (typically associated with the erased state) and the other state a logical "0" (typically associated with the charged state).

In Multi-Level Cell (MLC) memory, the gate in each memory cell may be set to four or more different voltage states, or ranges, thereby providing a data density of two or more data bits per cell. MLC memory is described, for example, in U.S. Pat. No. 5,043,940, to Harari, and in U.S. Pat. No. 5,172,338, to Mehrotra et al., which are incorporated herein by reference.

As the density of an MLC device increases, the ranges defining voltage states necessarily become narrower. Consequently, the tolerance to actual and apparent shifts in cell voltages is reduced. In flash memory, actual shifts in the charge stored in a cell can occur when reading, programming or erasing a neighboring cell, due to electrical coupling between cells, as well as due to leakage of charge through the oxide insulating the gate of the cell over long periods of storage time. Apparent shifts may also occur due to field coupling between cells, an effect described in U.S. Pat. No. 5,867,429, to Chen et al., and in U.S. Pat. No. 5,930,167, to Lee et al., which are incorporated herein by reference. U.S. Pat. No. 5,930,167 further describes selectively programming portions of a multi-state memory as cache memory, in only two states or with a reduced margin, in order to shorten the time necessary to initially program the data. This data is later read and re-programmed into the memory in more than two states, or with an increased margin.

In certain types of MLC memory, multiple bits are stored in a cell simultaneously, whereas in other types, bits may be stored incrementally. In the latter case, a first bit is written (or "programmed") to the least significant bit (LSB) of the cell by increasing the charge of the cell by a first increment. A second bit may then be stored (to the most significant bit, or "MSB," in a two-bit cell) by increasing the charge by a further increment. U.S. Patent Application Publication 2007/0133249, to Roohparvar, which is incorporated herein by reference, describes storing a single bit in a cell of an MLC device. The cells to be programmed are initially programmed with the desire data into either the least significant or most significant bit of the cell. A second programming operation programs reinforcing data that adjusts the threshold level of the cell to the appropriate level for the desired data.

U.S. Patent Application Publication 2006/0171210, to Nagashima et al., which is incorporated herein by reference, describes storing a flag with each block of cells of an MLC device. The flag indicates whether the cells of the block are to be programmed as SLC cells or as MLC cells.

U.S. Pat. No. 7,164,601, to Mitani et al., which is incorporated herein by reference, describes setting a bit of a storage address designation so as to determine whether data is stored by an SLC operation mode or by an MLC operation mode.

SUMMARY OF THE INVENTION

Embodiments of the present invention provide apparatus and methods for storing input data in a group of cells in an MLC memory device at a density that is lower than the designed density of the device. Dummy data is stored to one or more bits of all cells in the group, thereby limiting the number of bits in each cell to which actual input data may be written. The dummy data is independent of the input data and typically has a uniform bit value that is chosen so as to maximize a difference between voltage states assumed by cells in the group. The increased difference between voltage states may improve the reliability of data storage.

There is therefore provided, in accordance with an embodiment of the present invention, a method for storing data, including:

in a memory array including cells configured for writing a first number of bits per cell, designating a group of the cells to which input data are to be written at a second number of bits per cell, smaller than the first number;

storing dummy data that are independent of the input data in a first set of one or more bits of the cells in the group; and writing the input data to a second set of at least one other bit of the cells in the group.

In disclosed embodiments, the dummy data include a uniform bit value that is stored to at least one of the bits in the first set in all of the cells in the group. Typically, the cells in the memory array have a predetermined set of voltage states, and the dummy data are selected so as to maximize a distance between the voltage states resulting from storing the dummy data and writing the input data.

In one embodiment, the first number is two, and the second number is one. In another embodiment, the first number is greater than two, while the second number may be greater than one.

The dummy data may be written to the memory array before writing the input data. Alternatively, storing the dummy data may include passing a command from a controller to a device including the memory array, instructing the device to set the one or more bits to a dummy value, without transferring the dummy data from the controller to the device.

There is also provided, in accordance with an embodiment of the present invention, a method for storing data, including:

in a memory array including cells configured for writing a first number of bits per cell representing a predetermined set of multi-bit codes that include at least first and second bits and correspond to different, respective voltage states of the cells, designating a group of the cells to which the data are to be written at a second number of bits per cell, smaller than the first number;

storing dummy data in the cells in the group, the dummy data including a uniform bit value that is stored as the first bit of all of the cells in the group and is selected so as to maximize a voltage difference between the voltage states corresponding to the multi-bit codes that contain the selected bit value as the first bit;

receiving input data for storage in the designated group of the cells; and writing the input data to the second bit of the cells in the group.

There is additionally provided, in accordance with an embodiment of the present invention, data storage apparatus, including:

a memory array including cells configured for writing a first number of bits per cell; and a memory controller, which is configured to store input data in a designated group of the cells at a second number of bits per cell, smaller than the first number, by causing dummy data that are independent of the input data to be stored in a first set of one or more bits of the cells in the group and writing the input data to a second set of at least one bit of the cells in the group.

The present invention will be more fully understood from the following detailed description of the embodiments thereof, taken together with the drawings in which:

BRIEF DESCRIPTION OF THE DRAWINGS

FIGS. 2A and 2B are graphs that schematically depict voltage states of cells of an MLC memory device, in accordance with an embodiment of the present invention; and FIG. 3 is a flowchart that schematically shows a process for writing data to a group of memory cells of an MLC memory device at a lower density than the designed density of the device, in accordance with an embodiment of the present invention.

DETAILED DESCRIPTION OF EMBODIMENTS

Figure 1:
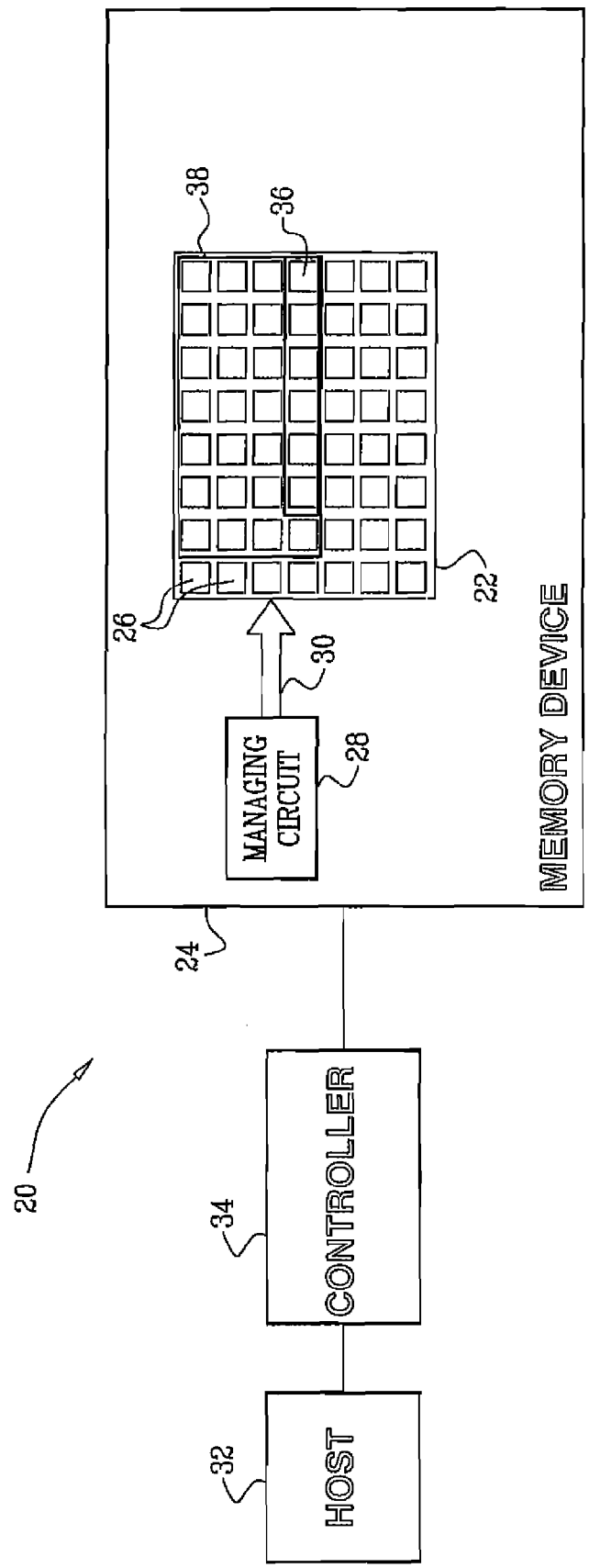
FIG. 1 is a block diagram that schematically illustrates a system for writing data to an MLC memory device at a lower density than the designed density of the device, in accordance with an embodiment of the present invention.

Reference is now made to FIG. 1, which is a block diagram that schematically illustrates a system 20 for storing data to a portion of a memory cell array 22 of an MLC memory device 24, in accordance with an embodiment of the present invention. Exemplary embodiments of the present invention described hereinbelow refer to non-volatile memory, and specifically flash memory, but principles of the present invention may be applied mutatis mutandis to other types of MLC memory.

Memory cell array 22 comprises memory cells 26, which are designed to retain four or more distinct voltage states, such that at least two bits of data may be stored to each cell. In the exemplary embodiment that is described hereinbelow, cells 26 have a two bit density, so that one bit of each cell is the less significant bit (LSB) and the other bit is the more significant bit (MSB). Alternatively, the principles of the present invention may be applied to memory devices that are designed to store three or more bits per cell.

Signals to control reading, programming, and erasing of cells 26 are generated by a managing circuit 28 and transmitted over control lines 30 in device 24 to array 22. In one embodiment, wherein memory cell array 22 has a NAND flash architecture, control lines 30 include word and bit select lines. These signals, as well as additional functionality that may be included in the managing circuit, such as read/write circuitry, address decoding circuitry, and power control circuitry, are described in detail in U.S. patent application Ser. No. 11/618,569, to Mokhlesi, filed Dec. 29, 2006, which is assigned to the assignee of the present patent application and which is incorporated herein by reference.

MLC memory device 24 in this embodiment provides memory storage for a host processor 32. Commands for reading and writing data are transmitted by host processor 32 to MLC memory device 24 via a controller 34, such as a logical block address access (LBA) controller. Controller 34 typically is implemented as a separate integrated circuit component from device 24 and serves as a standardized interface between host processor 32 and the MLC memory device. In some embodiments, however, at least some of the functions of controller 34 may be included within a single semiconductor device that also comprises the MLC memory device. Alternatively or additionally, host processor 32 may be configured to carry out some or all of the functions of the controller.

In the present embodiment, it is assumed that controller 34 receives from host processor 32 input data to be written to the MLC memory device. Controller 34 typically divides the input data into segments, referred to as pages, and determines corresponding page addresses in memory array 22 to which the data will be written. A typical page size is 2,048 bytes.

Within memory array 22, pages are typically stored as bit planes that extend across multiple memory cells. For example, bits of one page may be stored at the least significant bit (LSB) of all cells in a group of cells, while bits of a second page are stored to a different bit of all the cells in the same group of cells. The number of bit planes associated with a group of cells equals the number of bits that may be stored in each cell. An exemplary group of cells is indicated in FIG. 1 as group 36. When the density of the MLC memory device is two-bits-per-cell, two pages are stored to group 36. One page, which may be designated by controller 34 as the "lower page," is stored to the LSB of each cell in the group, and the bits of the second page, designated the "upper page," are stored to the most significant bit (MSB) of each cell.

Memory cell array 22, in addition to being divided into groups of cells for page programming, is also generally divided into blocks of cells, exemplified in FIG. 1 by a block 38. Block erase signals generated by managing circuit 28 cause all cells in a given block to be set to a lowest charge state. The size of a block is typically much larger than the page size. Implementations of block erase and page programming are further described in the abovementioned U.S. patent application Ser. No. 11/618,569.

Although controller 34 generally writes two bits of data to each cell in array 22, in some cases the controller may determine that certain data should be written to a group of cells in the array as only a single bit per cell. The decision to write data at reduced density may be made by the controller itself, or it may be invoked externally, by the host processor, for example. In such cases, the controller may cause dummy data to be stored in one of the bits in a group of the cells, and may write the actual data to the other bit. The value of the dummy data is independent of the actual data and is chosen, as explained below, so as to enhance the reliability of storage of the single-bit-per-cell data.

FIGS. 2A and 2B are graphs depicting voltage states of cells of an MLC memory device, in accordance with an embodiment of the present invention. FIG. 2A is a graph 200 depicting all possible voltage states of cells of an MLC memory device that has a density of two-bits-per-cell. Four voltage states 202 are shown, labeled as E, A, B, and C. The voltage states are graphed along the x-axis by the voltage threshold of the cells. The y-axis represents a statistical frequency of a given threshold for each cell.

The lowest state, E, which is the erased state of a cell, typically represents the two-bit binary code 11. A higher voltage state A may represent binary code 10, meaning 0 is stored as the LSB (the first bit written), and 1 as the MSB. To the right of state A are shown voltage states B and C, which may represent, respectively, binary codes 01 and 00. Other binary coding combinations may also be implemented.

As indicated by graph 200, voltage states 202 generally cover a range of voltage threshold values. Because these ranges do not overlap, the ranges may be differentiated by reference voltages, indicated as Vra, Vrb, and Vrc. Typical values for these reference voltages in an exemplary embodiment are 0V, 1.25V, and 2.5V, respectively.

As described in the Background, above, shifts in the voltage level of a cell may occur over time, causing voltage ranges to spread. Voltage states 204, indicated by broken lines, show possible spreading of voltage states 202. Due to the spreading, the ranges may overlap, causing read errors.

If controller 34 were to write one bit per cell to a selected group of cells in array 22 without writing dummy data, the data would be stored in the LSB of the cells in question, while the unwritten MSB would contain the default value 1. In such a case, the cells would be in either state E or state A, depending on the stored data value. Voltage spreading could thus cause read errors between the states, while the more distant states B and C are unused.

FIG. 2B is a graph 210 depicting voltage states 212 of cells programmed with one bit of input data and one bit of dummy data, in accordance with an embodiment of the present invention. A process for programming dummy data to the MLC memory device is described further hereinbelow with respect to FIG. 3. In this case, the LSB of each cell is set with a dummy value of "0." After programming with the actual input data, the cells assume two possible voltage states: state A, corresponding to the binary code 10, and state C, corresponding to the binary code 00, depending on the data value written to each cell. The cells are effectively set to a density of one-bit-per-cell, rather than the designed two-bit-per-cell density of the MLC memory device, but the allowed voltage states are now space farther apart than in the example shown in FIG. 2A.

Dotted lines in FIG. 2B indicate possible level shifting of states 212 to respective states 214. As shown, even after level shifting occurs, the voltage ranges do not overlap, and there are unallowed states that separate and more clearly differentiate the allowed states.

In the above example, a dummy bit value of 0 in the LSB position is useful in spreading apart the voltage states as shown in FIG. 2B, because of the way in which the two-bit data values (11, 10, 01 and 00) are mapped to voltage ranges in memory device 24. In other devices, however, with different mappings, it may be preferable to write dummy data to the MSB, rather than the LSB. For MLC memory with more than two-bit density, dummy data may be written to one or more of the bits, so that the actual data is stored at one bit per cell or a larger number of bits per cell that is less than the design capacity of the memory. The dummy data is likewise chosen so as to spread apart the voltage states that are used to store the actual data.

FIG. 3 is a flowchart depicting a process 300 for programming a group of cells of MLC memory array 22, such as the group of cells in block 38, with a lower data density than the designed density of the array, in accordance with an embodiment of the present invention. Group 36 may comprise any number of cells in array 22, but in flash memory typically comprises an integral number of rows, or pages.

At a first step 302, cell block 38 is initialized by a block erase signal issued by managing circuit 28. All cells in block 38 are typically initialized to an erase state representing a binary code value of 11.

Next, at a storage request step 304, host processor 32 issues a request that certain data be stored at lower data density. The host may issue such a request, for example, when storing program code, because such code may be severely affected by even a single data error. By contrast, a small number of errors may have a negligible effect on other types of data, such as data comprising audio or visual content. For MLC memory with more than two-bit density, the host processor may specify a desired density level.

The request from the host is received by controller 34. At a page determination step 306, controller 34 breaks the input data into pages for storage to the MLC memory device. To implement the lower density storage request, controller 34 also generates pages of dummy data. For example, for an MLC memory device with a designed density of two-bits-per-cell, controller 34 generates one page of dummy data for each page of input data, such that the density of data storage is effectively reduced to one-bit-per-cell, as described above with respect to FIG. 2B. As noted earlier, the dummy data values are independent of the actual data values, and there is thus no need for controller 34 or managing circuit 28 to process the actual data values in order to determine the dummy data that is to be written to each cell. Consequently, it is also possible for the controller to write the dummy data to the appropriate pages of the memory device before it writes (or even receives) the actual data to be written to these pages.

Typically, the controller writes dummy data pages to lower page addresses, corresponding to one or more lower bits of the cells in the group (i.e., lower bit planes), and writes actual input data to upper page addresses, corresponding to one or more of the higher bits. More generally, however, the page addressing (i.e., the bit plane selection), as well as the value of the dummy data written, is set according to the specifications of the MLC memory device so as to maximize the distance between voltage states of the cells. The bit plane addressing and the values of the dummy data depend on the design of the memory device itself and are not dependent on the values of the input data.

Typically, the controller transmits both input data pages and dummy data pages to the MLC memory device. When the input data does not fill an entire page, the controller may fill a partial page with the input data and fill a corresponding partial page with dummy data. In an alternative embodiment, managing circuit 28 is configured to implement an instruction setting all bits in a page to a specific value. The controller may then be configured to issue this instruction, indicating the dummy bit value to be set, rather than sending entire pages of dummy data.

At steps 308 and 310, managing circuit 28 receives dummy data and input data pages respectively from the controller and stores both types of pages to the specified page addresses. Each page, whether a page of input data or of dummy data, is stored using the same procedure as would be used under normal device operation at the designed density. However, because dummy data fills one or more bit planes in groups of cells, as described above, the input data is effectively stored at a lower density. Voltage states are separated by greater distances, thereby improving data reliability. These steps may be carried out by a conventional MLC memory device without modification. Alternatively, as noted above, the managing circuit may implement a special instruction from the controller to set an entire page to a specific dummy bit value.

At a read step 312, controller 34 retrieves data requested by the host processor. Typically, controller 34 will read only the input data pages, ignoring the dummy data pages previously stored to the MLC memory device. Alternatively, the controller may also read dummy data pages as a means of confirming data validity. If any bits of a dummy page are not set to the proper dummy bit value, a data error will be detected. In a further embodiment, the controller may also be configured to correct a bit of input data, based on an error detected in a dummy bit.

As noted earlier, the principles of the present invention may similarly be applied to MLC memory that is designed to store three or more bits per cell. For example, a three-bit-per-cell memory may be used to store two bits per cell, with dummy data stored in the third bit of each cell. Alternatively, such a memory could be used to store a single bit per cell, with dummy data stored in one or both of the remaining bits in each cell. The dummy data is chosen, as exemplified above by FIG. 2B, so that the voltage states available for storing the actual data are spaced apart, thus enhancing storage reliability. On the other hand, the dummy data is uniform over the group of cells in question and is independent of the actual data stored in the other bit or bits. Generally speaking, dummy data may be used in this manner in any situation in which n-bit MLC cells are to be used to store m bits per cell of data, for m<n.

As an example, suppose that a single bit per cell is to be stored in a three-bit-per-cell memory, in which the eight possible states correspond to the data values {111, 101, 110, 010, 011, 100, 000, 001}, ordered from left to right on the voltage axis as in FIG. 2A. Simply skipping two bits in each cell, and writing data only to the third bit, will provide a separation of four states at most between the data states. On the other hand, if the dummy data value 01 is written to the two LSB of all the cells, adding a single bit of input data will give the states 101 and 001 for one-bit-per cell storage. These data states are separate by an interval of six states, while the dummy bits are fixed and independent of the input data.

Although the embodiments described above relate mainly to certain types of flash memory, the principles of the present invention may similarly be applied to other types of MLC memory. The embodiments described above are thus cited by way of example, and the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for storing data, comprising:
   in a memory array comprising cells configured for writing a first number of bits per cell, designating a group of the cells to which input data are to be written at a second number of bits per cell, smaller than the first number;
   storing dummy data that are independent of the input data in a first set of one or more bits of the cells in the group; and
   writing the input data to a second set of at least one other bit of the cells in the group.

2. The method according to claim 1, wherein the dummy data comprise a uniform bit value that is stored to at least one of the bits in the first set in all of the cells in the group.

3. The method according to claim 1, wherein the cells in the memory array have a predetermined set of voltage states, and wherein the dummy data are selected so as to maximize a distance between the voltage states resulting from storing the dummy data and writing the input data.

4. The method according to claim 1, wherein the first number is two, and the second number is one.

5. The method according to claim 1, wherein the first number is greater than two.

6. The method according to claim 5, wherein the second number is greater than one.

7. The method according to claim 1, wherein storing the dummy data comprises writing the dummy data to the memory array before writing the input data.

8. The method according to claim 1, wherein storing the dummy data comprises passing a command from a controller to a device comprising the memory array, instructing the device to set the one or more bits to a dummy value, without transferring the dummy data from the controller to the device.

9. A method for storing data, comprising:
   in a memory array comprising cells configured for writing a first number of bits per cell representing a predetermined set of multi-bit codes that comprise at least first and second bits and correspond to different, respective voltage states of the cells, designating a group of the cells to which the data are to be written at a second number of bits per cell, smaller than the first number;
   storing dummy data in the cells in the group, the dummy data comprising a uniform bit value that is stored as the first bit of all of the cells in the group and is selected so as to maximize a voltage difference between the voltage states corresponding to the multi-bit codes that contain the selected bit value as the first bit;
   receiving input data for storage in the designated group of the cells; and
   writing the input data to the second bit of the cells in the group.

10. The method according to claim 9, wherein storing the dummy data comprises selecting the uniform bit value independently of the input data.

11. Data storage apparatus, comprising:
    a memory array comprising cells configured for writing a first number of bits per cell; and
    a memory controller, which is configured to store input data in a designated group of the cells at a second number of bits per cell, smaller than the first number, by causing dummy data that are independent of the input data to be stored in a first set of one or more bits of the cells in the group and writing the input data to a second set of at least one bit of the cells in the group.

12. The apparatus according to claim 11, wherein the dummy data comprise a uniform bit value that is stored to at least one of the bits in the first set in all of the cells in the group.

13. The apparatus according to claim 12, wherein the cells in the memory array have a predetermined set of voltage states, and wherein the dummy data are selected so as to maximize a distance between the voltage states resulting from storing the dummy data and writing the input data.

14. The apparatus according to claim 11, wherein the first number is two, and the second number is one.

15. The apparatus according to claim 11, wherein the first number is greater than two.

16. The apparatus according to claim 15, wherein the second number is greater than one.

17. The apparatus according to claim 11, wherein the memory controller is configured to write the dummy data to the memory array before writing the input data.

18. The apparatus according to claim 11, and comprising a memory device, which comprises the memory array and a managing circuit, wherein the memory controller is configured to pass a command to the device, instructing the device to set the one or more bits to a dummy value, without transferring the dummy data from the controller to the device, and wherein the managing circuit is configured to set the one or more bits to the dummy value in response to the command.

* * * * *